United States Patent [19]
Weisman

[11] Patent Number: 4,819,713
[45] Date of Patent: Apr. 11, 1989

[54] RETAINER FOR ELECTRONIC MODULES

[75] Inventor: Arnold M. Weisman, Glendora, Calif.

[73] Assignee: Calmark Corporation, San Gabriel, Calif.

[21] Appl. No.: 42,461

[22] Filed: Apr. 23, 1987

[51] Int. Cl.$^4$ .............................................. F28F 7/00
[52] U.S. Cl. .................................... 165/1; 165/80.2; 165/80.3; 361/388; 361/395; 211/41; 174/16.3
[58] Field of Search .................... 165/80.1, 80.2, 80.3, 165/80.4, 80.5; 361/388, 385, 386, 395; 174/16 HS; 211/41

[56] References Cited

U.S. PATENT DOCUMENTS

| | | | |
|---|---|---|---|
| 3,767,058 | 10/1973 | Barlow et al. | 211/41 |
| 4,298,904 | 11/1981 | Koenig | 361/388 |
| 4,414,605 | 11/1983 | Chino | 361/388 |
| 4,480,287 | 10/1984 | Jensen | 361/388 |

FOREIGN PATENT DOCUMENTS

| | | | |
|---|---|---|---|
| 2840921 | 9/1978 | Fed. Rep. of Germany | 361/386 |
| 2101812 | 1/1983 | United Kingdom | 361/386 |

Primary Examiner—Ira S. Lazarus
Assistant Examiner—Sue Wagarman
Attorney, Agent, or Firm—Spensley Horn Jubas & Lubitz

[57] ABSTRACT

A retainer for retaining an electronic module, like a printed circuit card, in the slots of a cold plate or other holder, comprising a rail mounted to either the module or holder. An end wedge is fastened to one end of the rail so as to provide a stop for other, typically wedge-shaped bodies, slid onto the rail. Both the rail and wedge bodies are particularly configured so that the wedge bodies remain aligned, or are precluded from rotating about the rail or otherwise becoming misaligned. The present invention thus provides an easily assembled retainer, which avoids the use of specially manufactured free-floating screws.

21 Claims, 2 Drawing Sheets

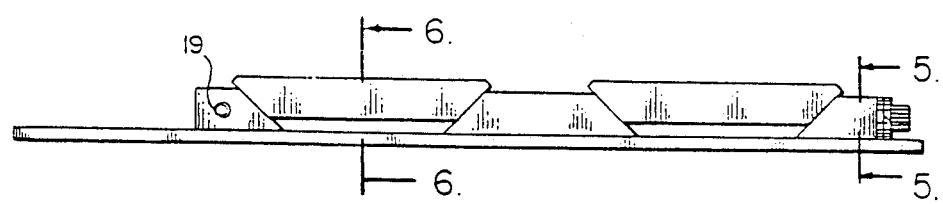
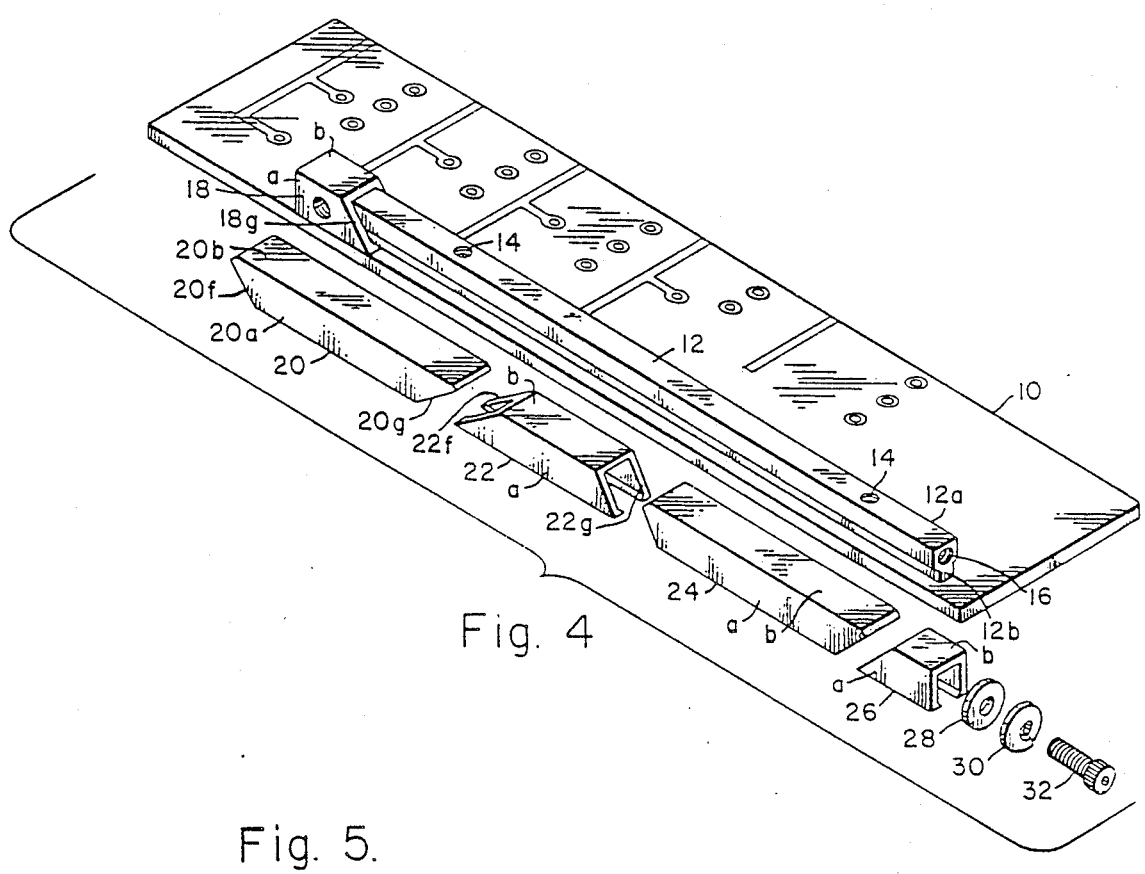
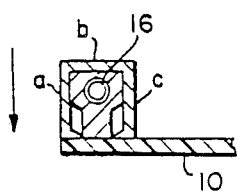
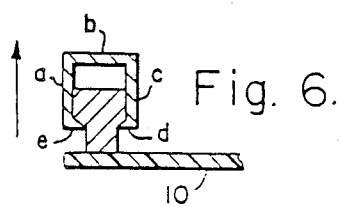

RETAINER FOR ELECTRONIC MODULES

BACKGROUND OF THE INVENTION

The present invention relates to a retainer for retaining electronic modules in a holder, and more particularly to a retainer for retaining printed circuit cards in a heat-exchanging cold plate.

The operation of printed circuit cards or other type electronic modules creates heat, which needs to be removed through a heat exchange with some form of heat sink. Often the heat sink used is a special plate, called a cold plate, which contains slots for holding individual printed circuit cards. The printed circuit cards are retained in the slots by a retainer, which is generally a thermal conductive metal block that is fastened along the printed circuit card to create a secondary thermal path. The retainer, along with the printed circuit card, is then placed into the slot of the cold plate.

As shown in FIG. 1a, the prior art retainer, manufactured by the assignee of this patent application, was made of at least four components: a specially manufactured screw 2, a front wedge 4, a body 6a, and a rear wedge 8. Each of these components had ramped ends. In addition, front wedge 4 and body 6a contained lengthwise slots so that they could be slid onto and be retained by screw 2. To further increase the length of this prior art card retainer, additional bodies could be added. In that case, a longer screw was required to be manufactured to accommodate the additional length.

In assembling the prior art retainer, body 6a was first mounted to the circuit card. Screw 2 was then slid through the slots of both front wedge 4 and the mounted body 6. At that point, other bodies could be slid onto screw 2. The additional bodies, however, were not mounted to the circuit card. Finally, rear wedge 8, which had a threaded slot that mated with the threads of screw 2, was threaded onto screw 2 to retain the various components.

The assembled retainer and circuit card unit was then slid into one of the slots of a cold plate. Rear wedge 8 was then tightened to press front wedge 4 and body 6a against the head of screw 2. As a result, ramped body 6a became offset, thereby causing the retainer to press against the sides of the slot.

In order to use the retainer and circuit card unit in another cold plate, rear wedge 8 had to be loosened to release the retainer's pressure against the slot walls. If rear wedge 8, however, was loosened too much, the various components could freely rotate about screw 2. For example, as shown in FIG. 1b, body 6b, a typical unmounted body, could rotate out of alignment with respect to the ramped ends of front wedge 4, body 6a (not shown) and rear wedge 8. As a result, before placing the assembled unit into the new cold plate slot, the various components had to be properly realigned with respect to their ramped ends. This process of realignment was both time consuming and costly.

As indicated, several disadvantages arose from using the prior art retainer. The screw had to be specially manufactured for the particular length of retainer that was desired. The retainer's various components tended to rotate around the screw, thereby making the alignment of the components difficult. In addition, since the screw was not fastened to the card, e.g., it was free-floating, the screw would tend to vibrate, occasionally at resonant frequency. As a result of such vibration, the metal screw would easily fatigue and quickly wear out. Additionally, the vibration would cause the rear wedge to loosen and occasionally unscrew itself off the screw.

An additional disadvantage of the prior art retainer was that it was not in continuous contact with either the circuit card or cold plate slot, since only one body was mounted to the card and the other bodies were offset. As a result of the discontinuous contact between the retainer and the circuit card or cold plate slot, the surface area for conducting both heat and pressure was reduced.

One objective of the present invention is to provide a retainer whose components are not easily misaligned. Another objective is to provide a retainer that supplies a better thermal path to a heat sink. More generally, the objective of the present invention is to provide an improved retainer that is able to overcome the above-mentioned disadvantages.

SUMMARY OF THE INVENTION

In accordance with the present invention, these and other objectives are achieved by providing a rail mounted to either the slotted plate or the electronic module. In this way, the mounted rail avoids the disadvantages of a free-floating screw, and also provides a continuous contact for heat exchange. Wedge components are provided, which are configured so that they slide onto the rail, and are unable to rotate about the rail. Stops are also provided at both ends of the rail to maintain the wedge components on the rail.

BRIEF DESCRIPTION OF THE DRAWINGS

A detailed description of the invention will be made with reference to the accompanying drawings, wherein like numerals designate corresponding parts of the several Figures.

FIG. 3 is a front view of the present invention's retainer in a compressed state;

FIG. 4 is an exploded view of the present invention's retainer;

FIG. 5 is a cross-sectional view of the front wedge of the retainer viewed along the line 5—5 of FIG. 3; and FIG. 6 is a cross-sectional view of one of the wedge bodies of the retainer viewed along the line 6—6 of FIG. 3.

DETAILED DESCRIPTION OF THE DRAWINGS

The following detailed description is of the best presently contemplated mode of carrying out the invention. This description is not to be taken in a limiting sense, but is made merely for the purpose of illustrating the general principles of the invention. The scope of the invention is best defined by the appended claims.

Figure 1A:
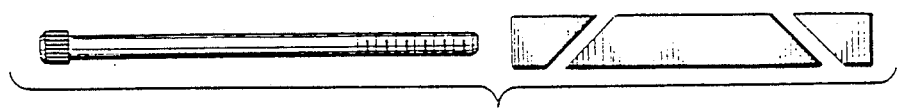
FIGS. 1a and 1b are views of the prior art retainer.
Figure 1B:
Figure 2:
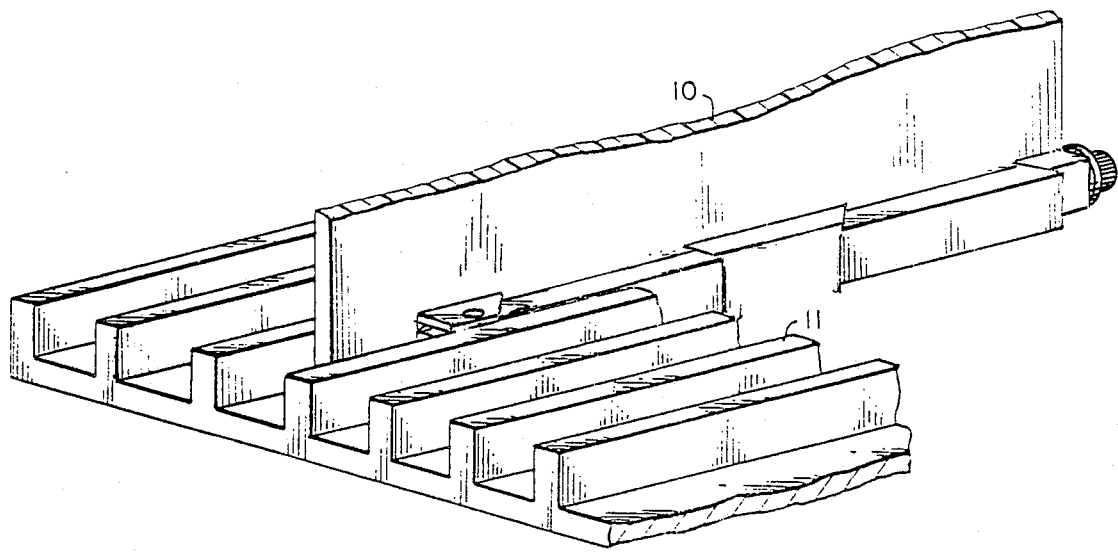
FIG. 2 is a view of a retainer in accordance with a preferred embodiment, which is shown fully assembled, connected to a printed circuirt board, and placed into a slot of a cold plate, with a portion of the cold plate removed.

As shown in FIG. 2, the present invention's retainer is preferably used to retain a printed circuit card 10 in the slots of a cold plate 11. The width of the slot is such that it exceeds the width of the printed circuit card and the retainer (in an uncompressed state). In that way, when the printed circuit card and retainer unit is placed into the slot, it does not fill the entire width of the slot.

As shown in FIG. 3, however, the effective width of the retainer may be adjustably increased by compressing its components together to create a staggered configuration. As a result, the retainer may be adjusted so as to apply retaining pressure against the walls of the slots of cold plate 11. In this way, the present invention's retainer may be generally used in a variety of cold plates or other holders for electronic modules, so long as the width of the holder is neither excessively large or small. Additionally, the retainer may be adjusted to apply extra retaining pressure against the slots of a cold plate or other type holder.

As shown in FIG. 4, the present invention's retainer includes a rail 12, wedge components 18, 20, 22, 24, 26, and fastening means 32. Rail 12 is preferably mounted through the use of screws, adhesives, or rivets 14, along its entire length to a printed circuit card 10 so that a continuous thermal contact is provided from printed circuit card 10 to cold plate 11. Rail 12 is configured to have a "T" bar-like cross-section along its length, comprising neck portion 12b and top portion 12a.

Wedge components 18, 20, 22, 24 and 26 are preferably similar with respect to the following features. These wedge components are all preferably thermally conductive so as to achieve one of the present invention's objectives in transferring heat to a heat sink. In addition, these wedge components should be configured so that they slide onto and particularly mate with rail 12 in a way that precludes the wedge components from becoming easily misaligned. In other words, the wedge components should not be able to rotate about the rail, or be removed from rail 12 except by sliding them off an end of the rail.

As shown in the preferred embodiment of FIGS. 5 or 6, each of the wedge components have three surface portions, a, b, and c. Surface portions a and c are preferably planar and trapezoidal in configuration, and surface portion b is preferably planar and rectangular in configuration. Each of the above wedge components also include retaining flanges d and e. Retaining flanges d and e are separated sufficiently apart to permit neck portion 12b of rail 12 to slide in between. Retaining flanges d and e, however, are sufficiently close so that the top portion 12a of rail 12 cannot pass through, as shown in FIG. 6. Retaining flanges d and e are also preferably configured so as to mate with the sloping sides of top portion 12a. In addition, retaining flanges d and e preferably stretch lengthwise along the entire lengths of the wedge components.

As a result of the trapezoidal configuration of surface portions a and c, the wedge components have ramped ends, f, g. The ramped ends of the wedge components are preferably configured so that they easily slide on top of one another, creating a staggered-like configuration, as shown in FIG. 3, when compressed together with sufficient pressure. As a result, the overall height of the present invention's retainer may be adjusted by adjusting the position of fastener 32.

A more particularized discussion of the wedge components will now follow. As shown in FIG. 4, first end wedge 18 and second end wedge 26 are provided at opposite ends of rail 12. First end wedge 18 is preferably attached onto rail 12 via expanding pin 19, as best seen in FIG. 3, and thereby provides a stop for the other wedge components. Second end wedge 26, however, need not be so attached. In that case, second end wedge 26 serves as a stop in conjunction with screw 32, which is screwed into threaded opening 16 of rail 12. Second end wedge 26 is preferably configured with an unramped front end so that screw 32 may equally apply pressure, through lock washer 30 and washer 28, against the front end so as to compress the various wedge bodies together, as shown in FIG. 3.

Wedge bodies 20, 22 and 24, and second end wedge 26, are slid onto rail 12 to complete the retainer structure, as shown in FIG. 3. The number of wedge bodies, and the length of each wedge body, may be varied in accordance with the type or size retainer desired. Consequently, wedge components may be standardized for manufacturing ease. In addition, wedge components may be added or subtracted, their number not being limited to the five wedge components shown in FIG. 4.

The assembly of the present invention's retainer is easily accomplished and will now be discussed with reference to FIG. 4. Depending on the size of printed circuit card 10, a particular length rail 12 is selected. Initially rail 12 may be of a standard length that may be shortened to the size of printed circuit card 10. After the proper length has been obtained, rail 12 is tapped at one end to form threaded opening 16. At the other end of rail 12, first end wedge 18 is attached to rail 12 via pin 19. Rail 12 is then fastened to printed circuit card 10 by, for example, rivets 14. In this preferred way, numerous combined rail-end wedge-circuit card units may be cheaply fabricated. In an alternative embodiment, rail 12 may be mounted onto a slot of a cold plate. Thus, combined rail-end wedge-holder units may be fabricated.

By mounting rail 12 to either the circuit card or holder, its entire length is in contact with the circuit card or holder, which thereby provides a larger surface area for heat transfer or for pressure contact. In addition, the mounted rail overcomes the disadvantages of a free-floating screw.

After fabrication of the initial unit, wedge body 20 may be slid onto rail 12 so that ramped end 20f comes into mating contact with ramped end 18g. Wedge body 22 is then similarly slid onto rail 12 so that its ramped end 22f comes into mating contact with ramped end 20g. In the same fashion, wedge body 24 and second end wedge 26 are slid onto rail 12. Finally, fastener 32 in conjunction with lock washer 30 and washer 28 is screwed into threaded opening 16 so as to retain the completely assembled wedge components together. Fastener 32 may also be adjusted to cause the ramped wedge bodies to slide on top of one another, resulting in a staggered configuration, as seen in FIG. 3.

As indicated earlier, the size and number of wedge bodies used may vary. For example, if a shorter retainer than that shown in FIG. 4 is required, one or more of the wedge bodies may be eliminated or another wedge body may be substituted. On the other hand, if a longer retainer is required, additional wedge bodies may be added or similarly, another wedge body may be substituted. Of course, the length of rail 12 should be tailored according to the desired retainer length.

The present invention may be embodied in other specific forms without departing from the spirit or essential characteristics thereof. For example, the number of wedge components and their overall configuration may be varied so long as they slide onto and are retained by the rail, and resist rotation about the rail. The wedge components need not have ramped ends. Any configuration of the wedge components which permits, upon the application of compressive pressure, a similar staggered-like configuration is encompassed by the present invention. Alternatively, instead of creating a staggered-like configuration, the height of the wedge components may be such that the retainer is retained by simply being wedged in the slots of a cold plate or other holder.

Further, the wedge components need not be thermally conductive since the present invention's retainer may be used simply to retain any type of module, and need not be limited for use with a printed circuit card, nor limited for use as a thermal path.

Accordingly, the presently disclosed embodiments are to be considered in all respects as illustrative and not restrictive, the scope of the invention being indicated by the appended claims, rather than the foregoing description. Consequently, any changes which come within the meaning and range of equivalence of the claims are therefore intended to be embraced by the present invention.

What is claimed is:

1. A retainer for retaining an electronic module in a holder, comprising:
   a rail;
   a wedge component configured to be slidingly received by the rail, the rail and wedge component being configured such that said wedge component is substantially prevented from rotating about said rail, said wedge component including a side surface portion that fits about an outer surface of the rail; and
   first and second stops provided at each end of the rail to retain the wedge component onto the rail.

2. A retainer as claimed in claim 1, wherein the first stop comprises an end wedge component.

3. A retainer as claimed in claim 1, wherein the first stop is attached to the rail.

4. A retainer as claimed in claim 1, wherein the wedge components are thermally conductive.

5. A retainer as claimed in claim 1 wherein the wedge components are configured in slide above one another.

6. A retainer as claimed in claim 1, wherein the wedge components have ramped ends.

7. A retainer as claimed in claim 1 wherein said rail is mounted to said electronic module.

8. A retainer as claimed in claim 1 wherein said rail is mounted to said holder.

9. A retainer as claimed in claim 1, wherein the second stop further comprises adjustable means for compressing the wedge components together.

10. A retainer as claimed in claim 1, wherein the second steop comprises an end wedge component.

11. A retainer as claimed in claim 10, wherein the second stop further comprises a screw.

12. A retainer as claimed in claim 11, wherein the rail is threaded for receiving the screw of the second stop.

13. A retainer for retaining an electronic module in a holder, comprising:
    a rail;
    a wedge component configured to be slidingly received by the rail, the rail and wedge component being configured such that said wedge component is substantially prevented from rotating about said rail said rail including a top portion that limits the perpendicular travel of the wedge component away from the rail; and
    first and second stops provided at each end of the rail to retain the wedge component onto the rail.

14. A retainer as claimed in claim 13, wherein the wedge components including flanges for contacting the top portion of the rail.

15. A retainer as claimed in claim 13 wherein the rail is configured with a substantially "T" bar-like cross-section.

16. A retainer for retaining an electronic module in a holder, comprising:
    a rail configured with a substantially "T" bar-like cross-section;
    a wedge component seated upon the rail, the wedge component and the rail being configured to cooperatively couple with each other so that rotational movement of the wedge component about the longitudinal axis of the rail is substantially prevented; and
    first and second stops provided at each end of the rail to retain the wedge component onto the rail.

17. A retainer as claimed in claim 16, wherein the rail and wedge components are further configured to limit the perpendicular travel of the wedge components away from the rail.

18. A retainer as claimed in claim 16 wherein the wedge components are thermally conductive.

19. A method for retaining an electronic module in a holder, comprising the steps of:
    mounting a rail configured with a substantially "T" bar-like cross-section to the electronic module;
    providing a stop at one end of the rail;
    sliding one or more wedge components onto the rail, the rail and wedge components being configured such that said wedge components are substantially prevented from rotating about said rail;
    providing a stop at the other end of the rail;
    placing the mounted rail in the holder; and
    adjusting the wedge components so that they place retaining pressure against the holder.

20. A method for retaining an electronic module in a holder, comprising the steps of:
    mounting a rail configured with a substantially "T" bar-like cross-section to the holder;
    providing a stop at one end of the rail;
    sliding one or more wedge components onto the rail, the rail and wedge components being configured such taht said wedge components are substantially prevented from rotating about said rail;
    providing a stop at the other end of the rail;
    placing the electronic module between the rail and the holder; and
    adjusting the wedge components so that they place retaining pressure against the electronic module.

21. A retainer for retaining an electronic module in a holder, comprising:
    a rail configured with a substantially "T" bar-like cross-section;
    a wedge component configured to be slidingly received by the rail, the rail and wedge component being configured such that said wedge component is substantially prevented from rotating about said rail; and
    first and second stops provided at each end of the rail to retain the wedge components onto the rail.

* * * * *